United States Patent
Catabay et al.

(10) Patent No.: US 6,800,940 B2
(45) Date of Patent: Oct. 5, 2004

(54) LOW K DIELECTRIC COMPOSITE LAYER FOR INTEGRATED CIRCUIT STRUCTURE WHICH PROVIDES VOID-FREE LOW K DIELECTRIC MATERIAL BETWEEN METAL LINES WHILE MITIGATING VIA POISONING

(75) Inventors: Wilbur G. Catabay, Saratoga, CA (US); Richard Schinella, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 105 days.

(21) Appl. No.: 10/099,641

(22) Filed: Mar. 15, 2002

(65) Prior Publication Data

US 2002/0123243 A1 Sep. 5, 2002

Related U.S. Application Data

(62) Division of application No. 09/426,056, filed on Oct. 22, 1999, now Pat. No. 6,391,795.

(51) Int. Cl.[7] .............................................. H01L 23/48
(52) U.S. Cl. ..................................... 257/759; 257/774
(58) Field of Search ................................. 438/760, 761, 438/780, 787; 257/750, 752, 759, 774, 776; 485/624, 631, 763; 174/141 C, 149 R

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |

(List continued on next page.)

FOREIGN PATENT DOCUMENTS

| | | | |
|---|---|---|---|
| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Nalwa, Handbook of Low and High Dielectric Constant Materials and Their Applications, vol. 1, p. 66, (1999).*

(List continued on next page.)

Primary Examiner—Kamand Cuneo
Assistant Examiner—Lisa Kilday
(74) Attorney, Agent, or Firm—John P. Taylor

(57) ABSTRACT

A composite layer of low k silicon oxide dielectric material is formed on an oxide layer of an integrated circuit structure on a semiconductor substrate having closely spaced apart metal lines thereon. The composite layer of low k silicon oxide dielectric material exhibits void-free deposition properties in high aspect ratio regions between the closely spaced apart metal lines, deposition rates in other regions comparable to standard k silicon oxide, and reduced via poisoning characteristics. The composite layer of low k silicon oxide dielectric material is formed by depositing, in high aspect ratio regions between closely spaced apart metal lines, a first layer of low k silicon oxide dielectric material exhibiting void-free deposition properties until the resulting deposition of low k silicon oxide dielectric material reaches the level of the top of the metal lines on the oxide layer. A second layer of low k silicon oxide dielectric material, having a faster deposition rate than the first layer, is then deposited over the first layer up to the desired overall thickness of the low k silicon oxide dielectric layer. In a preferred embodiment, the steps to form the resulting composite layer of low k silicon oxide dielectric material are all carried out in a single vacuum processing apparatus without removal of the substrate from the vacuum apparatus.

5 Claims, 5 Drawing Sheets

U.S. PATENT DOCUMENTS

| | | | |
|---|---|---|---|
| 5,194,333 A | | 3/1993 | Ohnaka et al. ............. 428/405 |
| 5,302,233 A | * | 4/1994 | Kim et al. .................. 438/692 |
| 5,314,845 A | | 5/1994 | Lee et al. .................... 437/238 |
| 5,364,800 A | | 11/1994 | Joyner ......................... 437/28 |
| 5,376,595 A | | 12/1994 | Zupancic et al. ............. 501/12 |
| 5,470,801 A | | 11/1995 | Kapoor et al. .............. 437/238 |
| 5,558,718 A | | 9/1996 | Leung .................... 118/723 E |
| 5,559,367 A | | 9/1996 | Cohen et al. .................. 257/77 |
| 3,832,202 A | | 8/1974 | Ritchie ....................... 106/287 |
| 3,920,865 A | | 11/1975 | Läufer et al. ............... 427/220 |
| 4,705,725 A | | 11/1987 | Glajch et al. ............... 428/405 |
| 4,771,328 A | | 9/1988 | Malaviya et al. ............. 357/49 |
| 5,580,429 A | | 12/1996 | Chan et al. ........... 204/192.38 |
| 5,628,871 A | | 5/1997 | Shinagawa .................. 438/514 |
| 5,675,187 A | | 10/1997 | Numata et al. ............. 257/758 |
| 5,688,724 A | | 11/1997 | Yoon et al. .................. 437/235 |
| 5,708,303 A | * | 1/1998 | Jeng ........................... 257/758 |
| 5,818,111 A | * | 10/1998 | Jeng et al. .................. 257/776 |
| 5,821,621 A | * | 10/1998 | Jeng ........................... 257/759 |
| 5,858,879 A | | 1/1999 | Chao et al. .................. 438/725 |
| 5,864,172 A | | 1/1999 | Kapoor et al. .............. 257/634 |
| 5,874,367 A | | 2/1999 | Dobson ....................... 438/787 |
| 5,874,745 A | | 2/1999 | Kuo ............................. 257/59 |
| 5,882,489 A | | 3/1999 | Bersin et al. .......... 204/192.35 |
| 5,904,154 A | | 5/1999 | Chien et al. .................. 134/1.2 |
| 5,913,140 A | * | 6/1999 | Roche et al. ............... 438/624 |
| 5,915,203 A | | 6/1999 | Sengupta et al. ........... 438/669 |
| 5,939,763 A | | 8/1999 | Hao et al. .................... 257/411 |
| 5,989,998 A | | 11/1999 | Sugahara et al. ........... 438/623 |
| 6,025,263 A | | 2/2000 | Tsai et al. .................... 438/624 |
| 6,028,015 A | | 2/2000 | Wang et al. ................. 438/789 |
| 6,037,248 A | | 3/2000 | Ahn ............................ 438/619 |
| 6,043,167 A | | 3/2000 | Lee et al. .................... 438/789 |
| 6,051,073 A | | 4/2000 | Chu et al. .................... 118/723 |
| 6,051,477 A | | 4/2000 | Nam .......................... 438/404 |
| 6,054,379 A | | 4/2000 | Yau et al. .................... 438/623 |
| 6,066,574 A | | 5/2000 | You et al. .................... 438/781 |
| 6,114,259 A | | 9/2000 | Sukharev et al. ........... 438/789 |
| 6,147,012 A | | 11/2000 | Sukharev et al. ........... 438/787 |
| 6,153,524 A | | 11/2000 | Henley et al. .............. 438/691 |
| 6,191,050 B1 | * | 2/2001 | Andideh ..................... 438/759 |
| 6,204,192 B1 | | 3/2001 | Zhao et al. .................. 438/723 |
| 6,215,087 B1 | | 4/2001 | Akahori et al. ......... 219/121.43 |
| 6,232,658 B1 | | 5/2001 | Catabay et al. ............. 257/701 |
| 6,303,047 B1 | | 10/2001 | Aronowitz et al. ............. 252/1 |
| 6,348,421 B1 | * | 2/2002 | Shu et al. .................... 438/631 |

OTHER PUBLICATIONS

Bothra, S., et al., "Integration of 0.25 µm Three and Five Level Inter–connect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Pursuing the Perfect Low–k Dielectric", *Semiconductor International*, vol. 21, No. 10, Sep., 1998, pp. 64–66, 68, 70, 72, and 74.

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

* cited by examiner

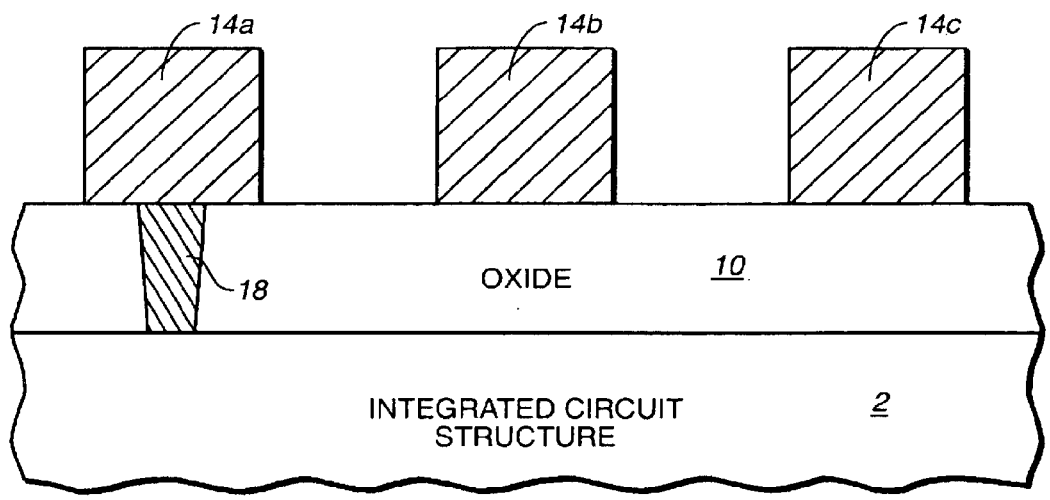
FIG._1
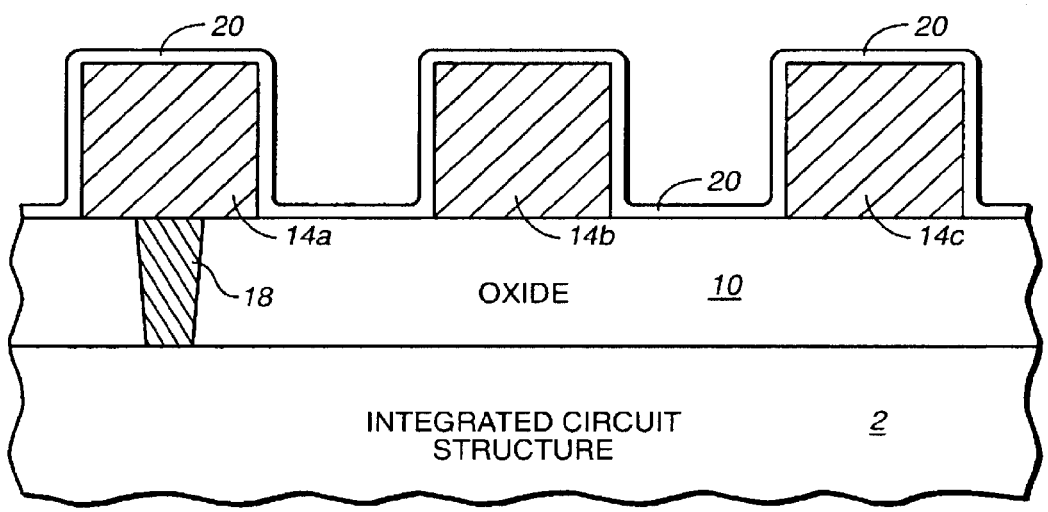
FIG._2

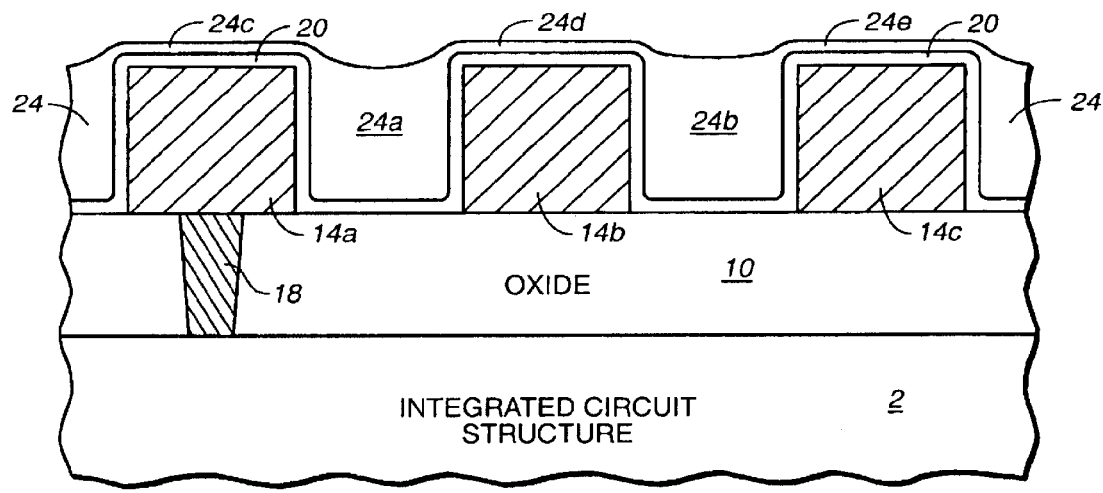
FIG._3
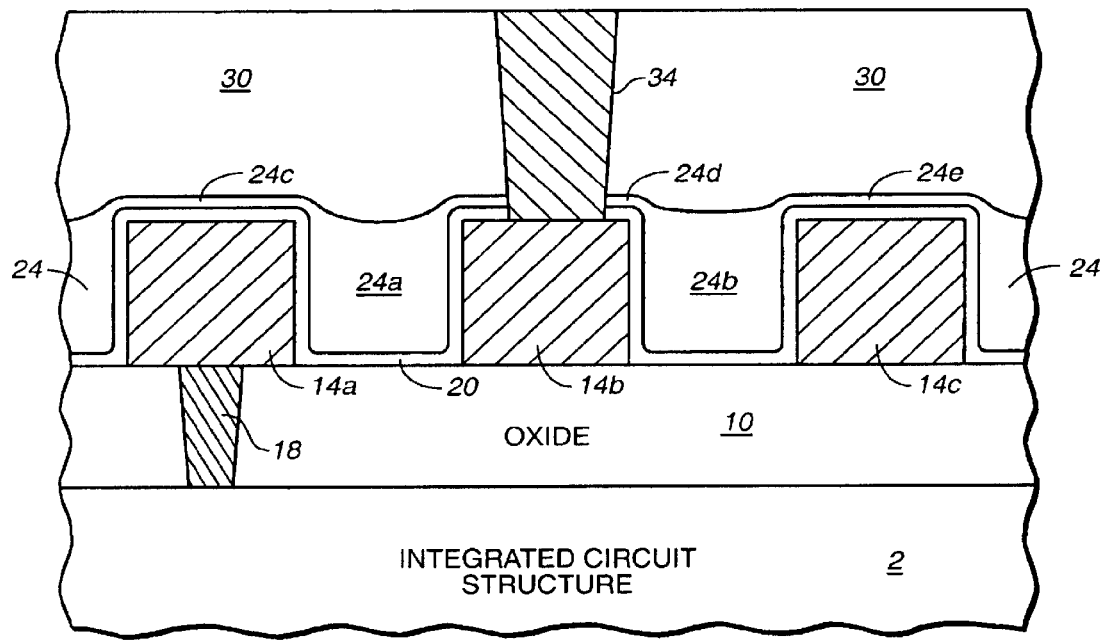
FIG._4

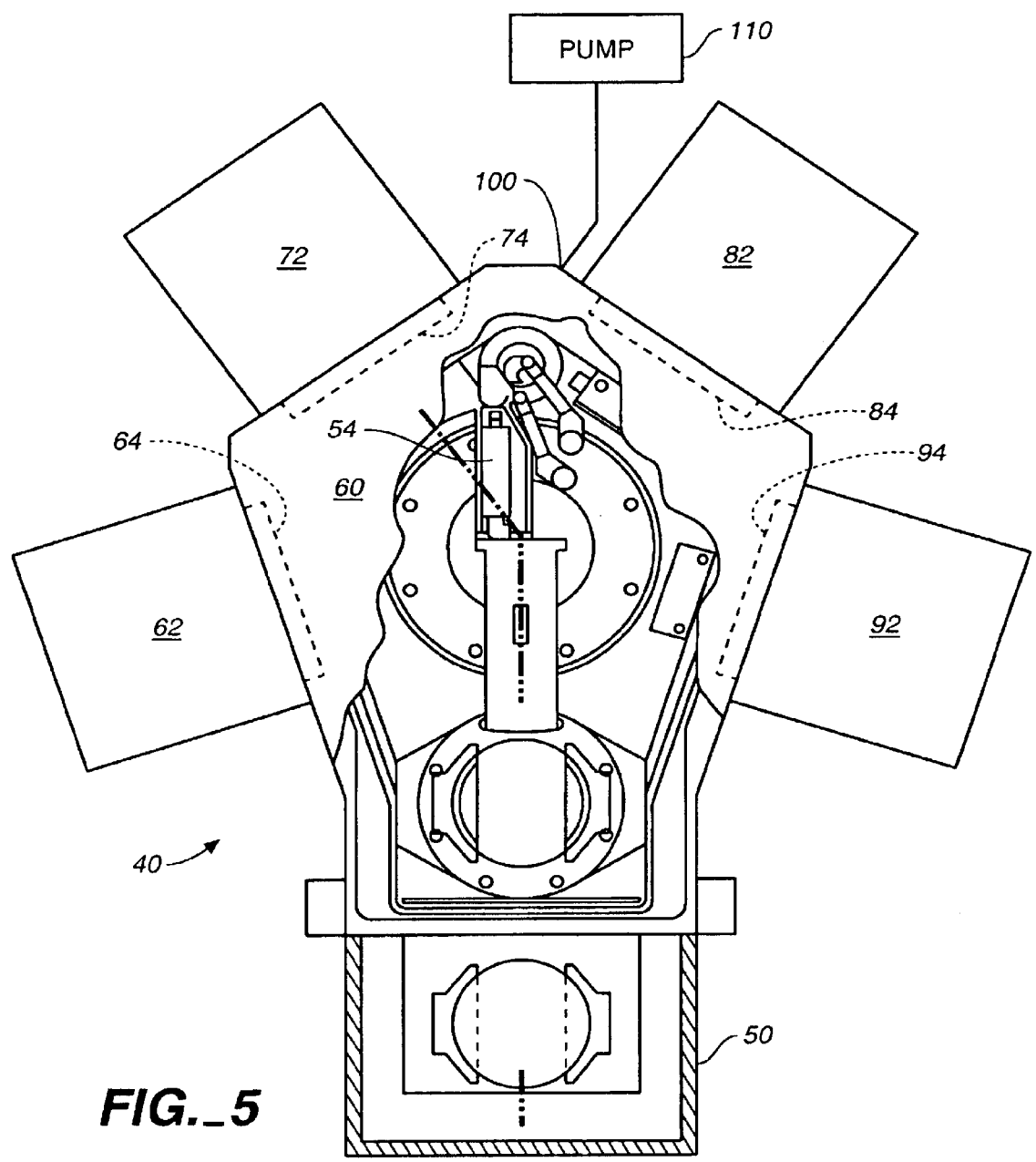
FIG._5

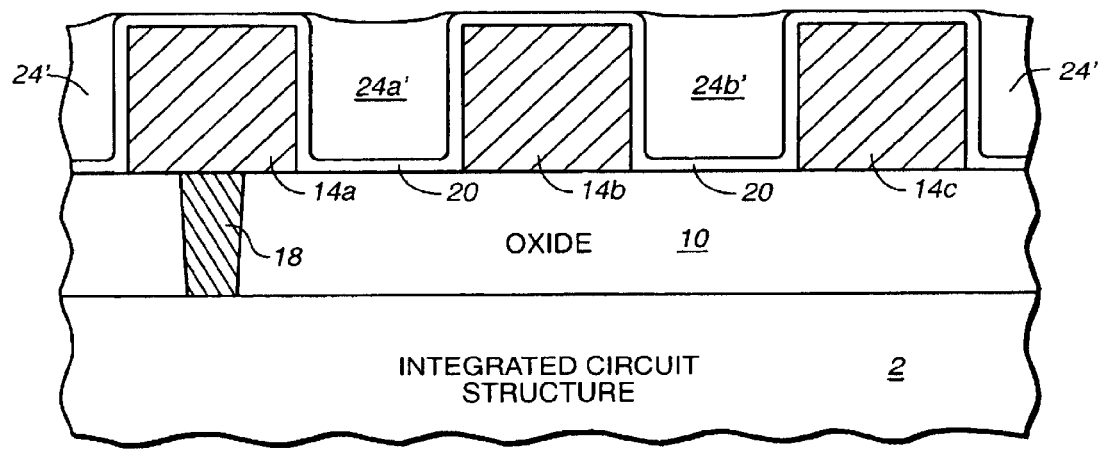
FIG._6
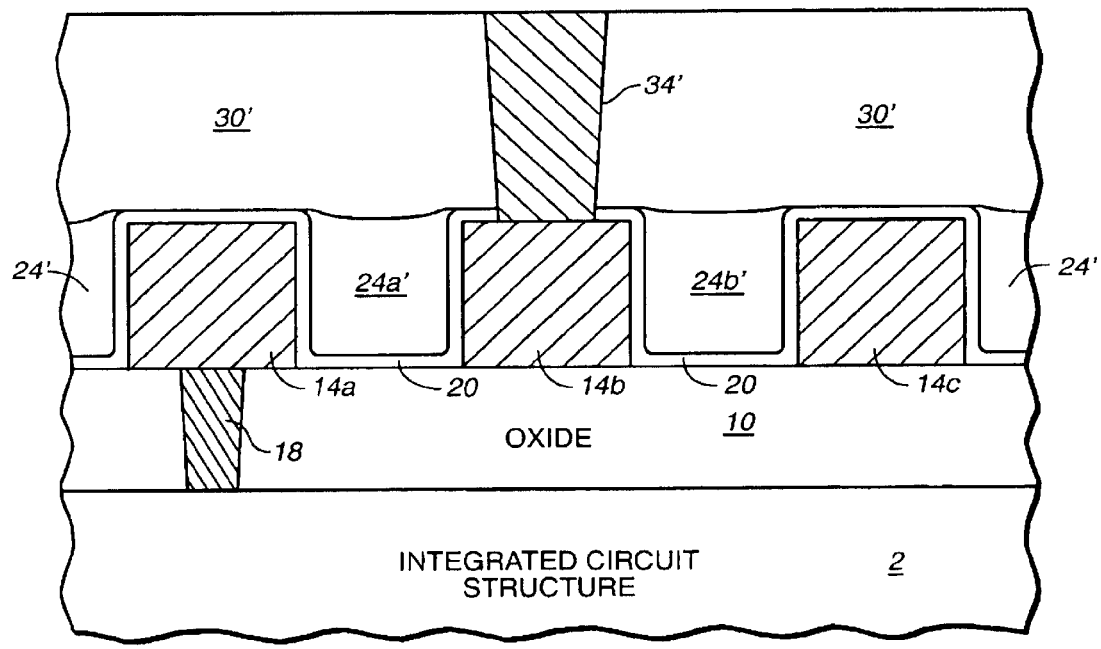
FIG._7

```
┌─────────────────────────────────┐
│  FORMING CLOSELY SPACED APART   │
│  METAL LINES ON AN OXIDE LAYER OF │
│  AN INTEGRATED CIRCUIT STRUCTURE │
│  ON A SEMICONDUCTOR SUBSTRATE   │
└─────────────────────────────────┘
                 │
                 ▼
┌─────────────────────────────────┐
│  DEPOSITING A THIN CONFORMAL BASE │
│  LAYER OF DIELECTRIC MATERIAL OVER │
│  THE METAL LINES AND THE OXIDE LAYER │
│  IN A VACUUM DEPOSITION APPARATUS │
└─────────────────────────────────┘
                 │
                 ▼
┌─────────────────────────────────┐
│  FORMING IN THE SAME VACUUM DEPOSITION │
│  APPARATUS A FIRST LAYER OF LOW K │
│  DIELECTRIC MATERIAL OVER THE STRUCTURE │
│  UP TO AT LEAST THE LEVEL OF THE TOP OF │
│  THE METAL LINES USING A LOW K SILICON │
│  OXIDE DIELECTRIC MATERIAL CAPABLE │
│  OF FILLING HIGH ASPECT RATIO REGIONS │
│  BETWEEN CLOSELY SPACED APART │
│  METAL LINES WITHOUT FORMING VOIDS │
└─────────────────────────────────┘
                 │
                 ▼
┌─────────────────────────────────┐
│  DEPOSITING IN THE SAME VACUUM │
│  DEPOSITION APPARATUS A SECOND LAYER │
│  OF LOW K DIELECTRIC MATERIAL OVER │
│  THE FIRST LAYER OF LOW K DIELECTRIC │
│  MATERIAL USING A PROCESS WHICH WILL │
│  DEPOSIT LOW K DIELECTRIC MATERIAL AT │
│  A RATE COMPARABLE TO DEPOSITION │
│  OF STANDARD K DIELECTRIC MATERIAL │
└─────────────────────────────────┘
```

*FIG._8*

LOW K DIELECTRIC COMPOSITE LAYER FOR INTEGRATED CIRCUIT STRUCTURE WHICH PROVIDES VOID-FREE LOW K DIELECTRIC MATERIAL BETWEEN METAL LINES WHILE MITIGATING VIA POISONING

This application is a division of application Ser. No. 09/426,056, filed Oct. 22, 1999, now U.S. Pat. No. 6,391,795 B1, issued May 21, 2002.

The subject matter of this application relates to the subject matter of Li, Catabay, and Hsia U.S. Pat. No. 6,423,628, issued Jul. 23, 2002, entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", filed by one of us with others on Oct. 22, 1999, assigned to the assignee of this application, and the subject matter of which is hereby incorporated herein by reference.

BACKGROUND OF THE INVENTION

1. Field of the Invention

This invention relates to integrated circuit structures. More particularly, this invention relates to the formation of a composite low k dielectric layer over and between metal lines of an integrated circuit structure.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Trikon process. The Peters article further states that in high density plasma CVD (HDP-CVD), dielectric material formed from methyl silane or dimethyl silane and $O_2$ can provide a k as low as 2.75; and that trimethyl silane, available from Dow-Corning, can be used to deposit low-k (2.6) dielectric films.

The use of this type of low k material has been found to result in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, the substitution of such low k dielectric materials for conventional silicon oxide insulation has not been without its own problems. Formation of the low k carbon doped dielectric material by the Trikon process is much slower than the conventional formation of undoped silicon oxide dielectric material. For example, in the time it takes to form a layer of low k dielectric material by the Trikon process on a single wafer, it may be possible to deposit a conventional dielectric layer of the same thickness on as many as 5 wafers.

However, even more importantly, it has been found that the subsequent formation of vias, or contact openings, through such low k dielectric material to the underlying conductive portions such as metal lines, or contacts on an active device, can contribute to a phenomena known as via poisoning wherein filler material subsequently deposited in the via, such as a titanium nitride liner and tungsten filler material, fails to adhere to the via surfaces. Apparently the presence of carbon in the low k dielectric material formed by the Trikon process renders the material more susceptible to damage during subsequent processing of the structure. For example, contact openings or vias are usually etched in the dielectric layer through a resist mask. When the resist mask is subsequently removed by an ashing process, damage can occur to the newly formed via surfaces of the low k material resulting in such via poisoning.

As mentioned above in the Peters article, high density plasma (HDP) has also been used to form void-free low k dielectric material. In this process, a high density plasma is used with methyl silane or dimethyl silane and $O_2$ to form a low k silicon oxide dielectric layer having a dielectric constant said to be as low as 2.75. However, the deposition rate of HDP low k dielectric material is similar to that of the Trikon process, making it also not economically attractive for the formation of a layer of low k dielectric material.

It has also been proposed to deposit low k silicon oxide dielectric material by other processes such as by plasma enhanced chemical vapor deposition (PECVD), using $CH_4$ and/or $C_4F_8$ and/or silicon tetrafluoride ($SiF_4$) with a mixture of silane, $O_2$, and argon gases. Plasma enhanced chemical vapor deposition is described more fully by Wolf and Tauber in "Silicon Processing for the VSLI Era", Volume 1-Process Technology (1986), at pages 171–174.

While the formation of a low k silicon oxide dielectric material by PECVD is much faster than the formation of the same thickness low k silicon oxide dielectric layer by the Trikon or HDP-CVD processes (i.e., at rates approaching the deposition rate of conventional silicon oxide), low k silicon oxide dielectric material deposited by PECVD has poor filling characteristics in high aspect ratio regions, resulting in the formation of voids in the dielectric materials deposited by PECVD in the spaces between the closely spaced apart metal lines in such structures.

In one embodiment in the aforementioned U.S. Pat. No. 6,391,795, low k silicon oxide dielectric material having a high carbon doping level is formed in the high aspect regions between closely spaced apart metal lines and then a second layer comprising a low k silicon oxide dielectric material having a lower carbon content is then deposited over the first layer and the metal lines. However, since both layers are formed by the Trikon process, the deposition rate does not radically change.

In the aforementioned U.S. Pat. No. 6,423,628, issued Jul. 23, 2002, a layer of silicon oxynitride (SiON) is formed over the top surface of the metal lines to serve as an anti-reflective coating (ARC), a hard mask for the formation of the metal lines, and a buffer layer for chemical mechanical polishing (CMP). Low k silicon oxide dielectric material having a high carbon doping level is then formed in the high aspect regions between closely spaced apart metal lines up to the level of the silicon oxynitride. CMP is then applied to planarize the upper surface of the low k carbon-doped silicon oxide dielectric layer, using the SiON layer as an etch stop, i.e., to bring the level of the void-free low k silicon oxide dielectric layer even with the top of the SiON layer. A conventional (non-low k) layer of silicon oxide dielectric material is then deposited by plasma enhanced chemical vapor deposition (PECVD) over the low k layer and the SiON layer. A via is then cut through the second dielectric layer and the SION to the top of the metal line. Since the via never contacts the low k layer between the metal lines, via poisoning due to exposure of the low k layer by the via does not occur.

It would, however, be highly desirable to provide a structure having a low k dielectric layer, and process for making same, wherein a composite layer of low k dielectric material can be formed having void-free filling characteristics for high aspect ratio regions between closely spaced apart metal lines while mitigating the poisoning of vias subsequently formed in the low k dielectric material and with less reduction of throughput in the deposition apparatus, using a process wherein all steps used to form such a composite layer could be carried out in the same vacuum processing apparatus. That is, the deposition steps could be carried out, for example, in multiple stations or multiple chambers in the same vacuum apparatus, to decrease contamination of the deposited materials as well as to improve the processing economics, including equipment investment and required space.

SUMMARY OF THE INVENTION

In accordance with the invention, a composite layer of low k silicon oxide dielectric material is formed on an oxide layer of an integrated circuit structure on a semiconductor substrate having closely spaced apart metal lines. The composite layer of low k silicon oxide dielectric material exhibits void-free deposition properties in high aspect ratio regions between the closely spaced apart metal lines, deposition rates in other regions comparable to standard k silicon oxide, and reduced via poisoning characteristics. The composite layer of low k silicon oxide dielectric material is formed by depositing, over the oxide layer and in high aspect ratio regions between the closely spaced apart metal lines, a first layer of low k silicon oxide dielectric material exhibiting void-free deposition properties until the resulting deposition of low k silicon oxide dielectric material reaches the level of the top of the metal lines on the oxide layer. A second layer of low k silicon oxide dielectric material, having a faster deposition rate than the first layer, is then deposited over the first layer up to the desired overall thickness of the low k silicon oxide dielectric layer. In a preferred embodiment, the steps to form the resulting composite layer of low k silicon oxide dielectric material are all carried out in a single vacuum processing apparatus without removal of the substrate from the vacuum apparatus.

BRIEF DESCRIPTION OF THE DRAWINGS

FIG. 1 is a fragmentary vertical cross-sectional view of an integrated circuit structure having an oxide layer formed thereon with metal lines formed over the oxide layer.

FIG. 2 is a fragmentary vertical cross-sectional view of the structure of FIG. 1 after having a base layer of dielectric material deposited over the metal lines and oxide layer.

FIG. 3 is a fragmentary vertical cross-sectional view of the structure of FIG. 2 after deposition of a first layer of low k dielectric material up to the height of the metal lines.

FIG. 4 is a fragmentary vertical cross-sectional view of the structure of FIG. 3 after deposition of a second layer of low k dielectric material over the first layer of low k dielectric material, and further showing a via cut through the second dielectric layer down to the top of one of the metal lines.

FIG. 5 is a top section view of a multiple chamber vacuum apparatus useful in the practice of the invention.

FIG. 6 is a fragmentary vertical cross-sectional view of the structure of FIG. 3 after a chemical mechanical polishing (CMP) of the first layer of low k dielectric material deposited over the metal lines and oxide layer in accordance with a second embodiment of the invention.

FIG. 7 is a fragmentary vertical cross-sectional view of the structure of FIG. 6 after deposition of a second layer of low k dielectric material over the polished first layer of low k dielectric material, and further showing a via cut through the second dielectric layer down to the top of one of the metal lines.

FIG. 8 is a flowsheet illustrating the process of the invention.

DETAILED DESCRIPTION OF THE INVENTION

The invention, in its broadest form, comprises a composite layer of low k silicon oxide dielectric material formed on an oxide layer of an integrated circuit structure wherein the composite layer exhibits void-free deposition properties in high aspect ratio regions between closely spaced apart metal lines, deposition rates in other regions comparable to standard k silicon oxide, and reduced via poisoning characteristics. The composite layer of low k silicon oxide dielectric material is formed by depositing over the oxide layer and the metal lines a first layer of a low k silicon oxide dielectric material exhibiting void-free deposition properties in high aspect ratio regions between closely spaced apart metal lines until the resulting deposition of low k silicon oxide dielectric material reaches the level of the top of the metal lines on the oxide layer. A second layer of low k silicon oxide dielectric material, having a faster deposition rate than the first dielectric layer, is then deposited over the first layer up to the desired overall thickness of the low k silicon oxide dielectric layer.

The term "low k", as used herein, is intended to define a dielectric constant of a dielectric material of 3.5 or less. Preferably, the dielectric constant of a "low k" material will be 3.0 or less.

The term "void-free", as used herein to describe the absence of voids in the first layer of low k dielectric material formed in the high aspect region between the metal lines, is intended to define a material have no voids therein discernable in cross-sections using scanning electron microscopy (SEM).

Referring now to FIGS. 1–4, the preferred process of the invention will be described. FIG. 1 shows a previously formed integrated circuit structure 2 formed on and in a semiconductor substrate (not shown) with an insulation layer 10, such as an oxide layer (e.g., silicon oxide), formed over integrated circuit structure 2. Insulation layer 10 may be formed over an underlying layer of metal interconnects (metal lines) forming a part of integrated circuit structure 2, or oxide layer 10 may be formed directly over devices such as, for example, MOS transistors, formed in the semiconductor substrate. Several parallel and closely spaced apart metal lines 14a–14c are shown formed over insulation layer 10. Metal lines 14a–14c normally will comprise a stack of conductive layers of metals and metal compounds such as, for example, a stack containing a titanium bottom layer, a titanium nitride layer, an aluminum (or aluminum/copper) main layer, and a titanium nitride capping layer, wherein each layer serves a specific purpose and the stack collectively functions to electrically connect one portion of the integrated circuit structure with another portion. By way of example, metal line 14a is shown in FIG. 1 connected to the underlying integrated circuit structure 2 by a via or contact opening 18 filled with a conductive material such as tungsten.

In FIG. 2, metal lines 14a–14c and insulation layer 10 are shown covered with a thin conformal barrier layer 20 of insulation such as a thin layer of conventional (standard k) silicon oxide deposited by plasma enhanced chemical vapor deposition (PECVD). Barrier layer 20 serves to isolate the first low k dielectric layer to be applied over barrier layer 20 from underlying oxide layer 18 and metal lines 14a–14c. Base layer will range in thickness from a minimum thickness of about 50 nanometers (nm) which is sufficient to provide the desired metallurgical separation up to a maximum thickness of about 500 nm. Barrier layer may be thicker, but it will be appreciated that since barrier layer 20 does not comprises low dielectric material, the use of thicknesses greater than the minimum needed to separate oxide layer 18 and metal lines 14a–14c from the first low k dielectric layer will have an adverse effect on the overall capacitance of the structure.

After deposition of barrier layer 20 over metal lines 14a–14c and oxide layer 18, the first layer 24 of low k silicon oxide dielectric material is deposited over the structure to form void-free low k dielectric material 24a and 24b respectively in the high aspect regions between closely spaced apart metal lines 14a–14c. The low k dielectric material and process used to fill these regions must be capable of forming void-free dielectric material having a dielectric constant of 3 or less in openings having a high aspect ratio of at least 2.5.

Such void-free low k silicon oxide dielectric material may be deposited by reacting hydrogen peroxide with a carbon-substituted silane such as methyl silane, as described in Dobson U.S. Pat. No. 5,874,367, the subject matter of which is hereby incorporated by reference. The void-free low k silicon oxide dielectric material may also be deposited by reacting a mild oxidant such as hydrogen peroxide with the carbon-substituted silane materials disclosed in Aronowitz et al. U.S. Pat. No. 6,303,047, and assigned to the assignee of this application, the subject matter of which is also hereby incorporated by reference.

Alternatively, the void-free low k dielectric material may be formed by using a high density plasma (HDP-CVD) process wherein oxygen ($O_2$) is reacted with either a mixture of silane and argon and a carbon-substituted silane, or a mixture of silane and argon and a fluorinated silane. High density plasma chemical vapor deposition (HDP-CVD) superimposes a plasma deposition process carried out at low frequency power, e.g., 400 kHz, and a sputter etching process carried out at high frequency, e.g., 13.56 MHz to provide a void-free deposition.

Any other deposition process capable of forming void-free low k silicon oxide dielectric material in the high aspect ratio regions between closely spaced apart metal lines can be substituted for the above-described processes.

Regardless of which process is used, in accordance with the invention, the void-free low k silicon oxide dielectric material is deposited until layer 24 of low k silicon oxide dielectric material reaches the height of metal lines 14a–14c. At this point the deposition process is halted. This end point may be empirically determined. Failure to deposit sufficient low k dielectric material to reach the top of metal lines 14a–14c may have a negative impact on either the absence of voids in the dielectric material or the capacitance developed horizontally between adjacent metal lines. On the other hand, an excessive amount of void-free low k silicon oxide dielectric material deposited above the height of metal lines 14a–14c could have an adverse effect with regard to via poisoning, as well as lowering the overall throughput time for forming the structure. As shown in FIG. 3, at 24c–24e, deposition of a slight excess of void-free low k dielectric material over the tops of metal lines 14a–14c, however, may be unavoidable. Generally, the height of the deposited void-free low k dielectric layer should be about ±50 nm of the height of the metal lines.

Turning now to FIG. 4, a second layer 30 of low k dielectric material is now deposited over the entire structure up to the desired thickness of the composite dielectric layer. This second layer of low k dielectric material will comprise a low k dielectric material capable of being deposited at a rate at least faster than the rate of deposition of the first layer, and preferably at a deposition rate comparable to the rate of deposition of conventional (non-low k) dielectric materials. For example, a low k carbon and/or fluorine-doped silicon oxide dielectric layer may be formed by adding $CH_4$ and/or $C_4F_8$ and/or silicon tetrafluoride ($SiF_4$) as additives or dopants to a mixture of silane, $O_2$ and argon gases in a PECVD process to deposit a low k silicon oxide dielectric layer at deposition rates comparable to non-low k dielectric materials.

The total thickness of second dielectric layer 30 will depend on the desired total thickness of low k dielectric material in the composite layer (low k dielectric layer 24 and low k dielectric layer 30). Many semiconductor dielectric applications require that a thick dielectric film of about 1.8 micrometers ($\mu$m) be initially formed and then polished back by CMP to about 700 nm (7 kÅ) to provide the required smooth surface for the next layer of metal lines. Thus, when the height of metal lines 14a–14c (and, therefore, the height of first low k layer 24 of dielectric material) is 560 nm (5.6 kÅ) and the total desired height of the composite low k dielectric layer comprising layer 24 and layer 30 is 1800 nm (18 kÅ), the height or thickness of second low k dielectric layer 30 will be about 1240 nm (12.4 kÅ). Usually the total thickness of the composite low k dielectric layer will range from about 1600 nm (16 kÅ) to about 3000 nm (30 kÅ), the height of the metal lines will range from about 500 nm (5 kÅ) to about 1200 nm (12 kÅ), and the thickness of second low k dielectric layer 30 will range from about 1000 nm (10 kÅ) to about 2400 nm (24 kÅ).

After formation of second low k silicon oxide dielectric layer 30, vias are cut through second layer 30 down to the underlying metal lines, such as filled via 34 shown in FIG. 4 cut through layer 30 down to metal line 14b. It will be noted that when the height of first low k dielectric layer 24 is slightly above the height of metal lines 14a–14c, vias such as via 34 cut through second low k dielectric layer 30 will pass through the portion (e.g., 24c–24e) of first low k dielectric layer 24 which is above metal lines 14a–14c. If this portion of low k dielectric layer 24 above metal lines 14a–14c is thin, i.e., less than 100 nm (1000 Å), any adverse via poisoning effects attributable to exposure of this portion of first low k dielectric layer 24 by formation of the via should be minimal.

In the preferred embodiment just discussed and illustrated in FIGS. 1–4, the steps to form the resulting composite layer of low k silicon oxide dielectric material may all be carried out in a single vacuum processing apparatus having multiple stations or multiple vacuum chambers. This permits the entire process of forming the composite low k dielectric layer to be carried out without removal of the wafer from the vacuum apparatus. This provides advantages in process economics, since throughput can be increased and only a single vacuum apparatus is used, thus providing savings in equipment investment and floor space. Also, by performing all of the steps in a single vacuum apparatus, exposure to atmospheric contamination is reduced, thus minimizing impact the effects of such atmospheric contamination on film properties and particle contamination.

FIG. 5 illustrates a typical commercially available multiple chamber vacuum apparatus such as the Endura multiple chamber vacuum apparatus available from Applied Materials, Inc. which may be used when the steps of the process are carried out in a single vacuum apparatus. The vacuum processing apparatus, the central portion of which is generally indicated at 40, is maintained under vacuum by a vacuum pump 110 through a port 100. A semiconductor substrate, already having the metal lines formed over an oxide layer, is introduced into the vacuum apparatus through a first load lock 50. A robot arm 54 in a central vacuum chamber 60 moves the semiconductor substrate from load lock 50 through central chamber 60 into a first vacuum processing chamber 62 through a slit valve 64. First vacuum processing chamber 62 could be used, for example, to deposit base dielectric layer 20 over the metal lines and oxide layer on the substrate by PECVD. After deposition of barrier layer 20, slit valve 64 is then opened and robot arm 54 removes the coated substrate back to central vacuum chamber 60. A slit valve 74 on a second vacuum processing chamber 72 is then opened and the substrate is placed in the second processing chamber by robot arm 54. In this chamber, void-free low k dielectric material is deposited to fill the spaces between the closely spaced apart metal lines.

Since this particular deposition step requires more processing time, the next vacuum processing chamber 82 may also be used to deposit the void-free low k material between the metal lines, i.e., chambers 72 and 82 could be used as parallel processing chambers to process two different substrates at the same time—or preferably at staggered but overlapping times. Robot arm 54 then removes the substrate from either chamber 72 through slit valve 74, or from chamber 82 through slit valve 84, and inserts it into vacuum processing chamber 92 through slit valve 94. The second layer of low k dielectric material is then be deposited, e.g., by PECVD, on the substrate over the metal lines, and over the void-free first layer of low k dielectric material between the metal lines until the desired thickness of the composite layer is reached. This substrate is then removed from chamber 92 and may then be removed from the vacuum apparatus for further processing which may, for example, comprise a CMP step in preparation for the formation of vias through the composite layer and the formation of a further layer or level of metal interconnects to be formed over the composite layer.

Thus, the formation of the barrier layer 20, the void-free first low k dielectric layer 24, and the second low k dielectric layer 30 can all be carried out in the multiple chambers of the same vacuum apparatus, resulting in improvements in both process economics as well as the quality of the processing.

While it is considered to be preferable to carry out all of the deposition steps to form the composite low k dielectric layer in a single vacuum apparatus, it is recognized that it may be desirable, in some applications, to eliminate any portions of the void-free layer on top of the metal lines so that vias subsequently formed down to the metal lines will not pass through any of the first (void-free) low k dielectric layer. Turning to FIGS. 6 and 7, this embodiment is illustrated. In FIG. 6, the structure of FIG. 3 is shown after a planarization step, such as a CMP step which removes portions 24c–24e of void-free first low k dielectric layer 24' from above metal lines 14a–14c, leaving void-free portions 24a' and 24b'. Of course, this requires removal of the substrate from the vacuum deposition apparatus after the step of forming void-free first low k dielectric layer 24'. However, as shown in FIG. 7, subsequent deposition of second low k dielectric layer 30', and formation of vias such as illustrated filled via 34' therethrough results in a via which does not pass through any portion of void-free dielectric layer 24'. No via poisoning attributable to exposure of layer 24', as a part of the sidewall of the via, can thus occur in this embodiment. Of course this embodiment, although requiring the planarizing step, still enjoys the advantage of the first embodiment of a more rapid deposition of the second layer of low k dielectric material, as compared to the deposition rate for the formation of the void-free low k dielectric material deposited in the first step when depositing void-free low k dielectric layer 24'.

The following will serve to further illustrate the invention.

EXAMPLE

A semiconductor substrate can be provided having an oxide layer thereon with metal lines formed over the oxide layer to a metal line thickness (height) of 560 nm, (5.6 kÅ) and an average horizontal spacing between the metal lines of about 270 nm. The substrate, when placed in a first plasma CVD 5 liter vacuum deposition chamber, would be maintained therein at a pressure of ~350 mTorr and a temperature of 350° C. 150 sccm of silane gas, 3500 sccm of $N_2O$, and 1500 sccm of $N_2$ gases would be flowed into the chamber and a plasma can be ignited in the chamber at a power level of about 100 watts. The deposition may be continued for about 11 seconds until a conformal base layer of silicon oxide of about 500 Å in thickness is formed over the metal lines and the oxide layer.

The coated substrate can then be moved to a second 5 liter vacuum deposition chamber in the same vacuum apparatus (without exposing the substrate to the ambient atmosphere) where 70 sccm of methyl silane, 19 sccm of silane, and 0.75 grams/minute of hydrogen peroxide are flowed into the chamber, while the chamber is maintained at a pressure of 900 mTorr and a temperature of ~5° C. This deposition is carried out for ~40 seconds to fill the high aspect ratio regions between the closely spaced apart metal lines with void-free low k carbon-doped silicon oxide dielectric material.

The substrate is then moved to a third vacuum chamber in the vacuum apparatus (again without exposing the coated substrate to ambient) where further low k silicon oxide dielectric material is deposited by PECVD over the previously deposited void-free low k carbon-doped silicon oxide dielectric material by flowing 150 sccm of tetramethyl silane and 500 sccm of $O_2$ into a 5 liter vacuum deposition chamber maintained at a pressure of 1000 mTorr and a temperature of ~17° C. A plasma is ignited in the chamber and maintained at a power of ~1000 watts during the deposition. This deposition may be carried out for 60 seconds to provide a second low k dielectric layer of about 1400 nm (14 kÅ).

The coated substrate can then be removed from the vacuum chamber, planarized by CMP, and vias may then be formed through the composite low k layer down to the metal lines. The substrate may then be examined for completeness of the via filling, i.e., to ascertain the amount of via poisoning. Substantially all of the vias will be found to be filled, indicating that the formation of the vias through the second layer of low k silicon oxide dielectric material, i.e., that the layer deposited by PECVD, does not contribute to via poisoning. Sectioning of the substrate followed by examination of the first low k silicon oxide dielectric layer using SEM should reveal the formation of a void-free low k dielectric material deposited in the high aspect ratio regions between the closely spaced apart metal lines.

Thus, the invention provides a composite layer of low k silicon oxide dielectric material wherein the portion of the composite low k layer of silicon oxide dielectric material deposited in the high aspect ratio regions between the closely spaced apart metal lines is void-free, while the second portion of the composite low k layer of silicon oxide dielectric material deposited above the first portion can be deposited at a much greater deposition rate, yet does not appear to contribute to poisoning of vias formed through the composite layer.

Having thus described the invention what is claimed is:

1. A composite layer of low k silicon oxide dielectric material on an oxide layer of an integrated circuit structure, said composite layer of low k silicon oxide dielectric material exhibiting void-free deposition properties in high aspect ratio regions between metal lines, deposition rates in other regions comparable to standard k silicon oxide, and without exhibiting via poisoning characteristics, comprising:
   a) a first layer of low k silicon oxide dielectric material exhibiting void-free deposition properties in high aspect ratio regions, deposited until said first layer of low k silicon oxide dielectric material completely fills said high aspect ratio regions between said metal lines and reaches the level of the top of metal lines on said oxide layer; and
   b) a second layer of low k silicon oxide dielectric material deposited over said first layer of low k silicon oxide dielectric material at a faster rate than the deposition rate of said first layer up to the desired overall thickness of the composite layer of low k silicon oxide dielectric material.

2. The composite layer of low k silicon oxide dielectric material of claim 1 wherein said first and second layers comprising said composite layer of low k silicon oxide dielectric material are all formed in a single vacuum processing apparatus without removal of said semiconductor substrate from said vacuum apparatus.

3. A composite layer of low k carbon-doped silicon oxide dielectric material on an oxide layer of an integrated circuit structure on a semiconductor substrate, said composite layer of low k carbon-doped silicon oxide dielectric material exhibiting void-free deposition properties in high aspect ratio regions, deposition rates comparable to non carbon-doped silicon oxide, and without exhibiting via poisoning characteristics, comprising:
   a) a first layer of low k carbon-doped silicon oxide dielectric material formed by reacting a carbon-substituted silane reactant with hydrogen peroxide until the resulting deposition of low k carbon-doped silicon oxide dielectric material reaction product reaches the level of the top of metal lines on the oxide layer; and
   b) a second layer of carbon-doped low k silicon oxide dielectric material formed over said first layer by plasma enhanced chemical vapor deposition (PECVD) up to the desired overall thickness of the low k carbon-doped silicon oxide dielectric layer.

4. A composite layer of low k silicon oxide dielectric material on an oxide layer of an integrated circuit structure on a semiconductor substrate having closely spaced apart metal lines thereon, said composite layer of low k silicon oxide dielectric material exhibiting void-free deposition properties in high aspect ratio regions between closely spaced apart metal lines, deposition rates in other regions comparable to standard k silicon oxide, and without exhibiting via poisoning characteristics, and said composite layer further comprising:
   a) a first layer of low k silicon oxide dielectric material exhibiting void-free deposition properties in high aspect ratio regions between said closely spaced apart metal lines, said first layer of low k silicon oxide dielectric material formed over said oxide layer and said metal lines up to at least the level of the top of said metal lines on said oxide layer, to completely fill said high aspect ratio regions between said metal lines, and planarized down to said top of said metal lines; and
   b) a second layer of low k silicon oxide dielectric material over said planarized first layer and said top of said metal lines, said second layer of low k silicon oxide dielectric material deposited at a higher deposition rate than said first low k layer.

5. A composite layer of low k carbon-doped silicon oxide dielectric material on an oxide layer of an integrated circuit structure on a semiconductor substrate, said composite layer of low k carbon-doped silicon oxide dielectric material exhibiting void-free deposition properties in high aspect ratio regions between closely spaced apart metal lines, deposition rates comparable to non carbon-doped silicon oxide, and without exhibiting via poisoning characteristics, said composite layer further comprising:
   a) a first layer of low k carbon-doped silicon oxide dielectric material formed over said oxide layer and said metal lines by reacting a carbon-substituted silane reactant with hydrogen peroxide until the resulting deposition of low k carbon-doped silicon oxide dielectric material reaction product reaches at least the level of the top of said metal lines on the oxide layer to form a low k silicon oxide dielectric material exhibiting void-free deposition properties in high aspect ratio regions between said closely spaced apart metal lines, said first layer of low k silicon oxide dielectric, material planarized down to said top of said metal lines; and
   b) a second layer of carbon-doped low k silicon oxide dielectric material formed over said planarized first layer and over said tops of said metal lines up to the desired overall thickness of the low k carbon-doped silicon oxide dielectric layer by plasma enhanced chemical vapor deposition (PECVD), said second layer of low k silicon oxide dielectric material deposited at a higher deposition rate than said first layer.

* * * * *